(12) United States Patent
Robinson

(10) Patent No.: US 8,334,084 B2
(45) Date of Patent: *Dec. 18, 2012

(54) METHOD FOR FABRICATING HIGH ASPECT RATIO NANOSTRUCTURES

(75) Inventor: Tod Evan Robinson, Boynton Beach, FL (US)

(73) Assignee: Rave LLC, Delray Beach, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/213,532

(22) Filed: Aug. 19, 2011

(65) Prior Publication Data

US 2011/0303062 A1    Dec. 15, 2011

Related U.S. Application Data

(63) Continuation of application No. 12/487,227, filed on Jun. 18, 2009, now Pat. No. 8,003,283.

(60) Provisional application No. 61/073,561, filed on Jun. 18, 2008, provisional application No. 61/073,555, filed on Jun. 18, 2008.

(51) Int. Cl.
*G03F 1/74* (2012.01)

(52) U.S. Cl. .......................................................... 430/5

(58) Field of Classification Search ................ 430/5, 30, 430/296; 850/21, 33, 34; 250/492.2, 492.22
See application file for complete search history.

(56) References Cited

U.S. PATENT DOCUMENTS

2003/0020025 A1*  1/2003  Nakayama et al. ........ 250/492.2
2009/0038383 A1*  2/2009  Nakaue et al. ................. 73/105

* cited by examiner

*Primary Examiner* — Stephen Rosasco
(74) *Attorney, Agent, or Firm* — Baker & Hostetler LLP

(57) ABSTRACT

A method for fabricating high aspect ratio nanostructures is provided. The method uses a nanomachining tip of an atomic force microscope to create an orthogonal series of isolated cuts that define a grid of high aspect ratio nanostructures in a work area on a substrate. Additional material can then be removed to smooth out at least one of the nanostructures in the work area.

13 Claims, 5 Drawing Sheets

METHOD FOR FABRICATING HIGH ASPECT RATIO NANOSTRUCTURES

CROSS-REFERENCE TO RELATED APPLICATIONS

This application is a continuation of U.S. Nonprovisional patent application Ser. No. 12/487,227, filed on Jun. 18, 2009, which claims priority to U.S. Provisional Patent Application Ser. Nos. 61/073,555, filed Jun. 18, 2008 and 61/073,561, filed Jun. 18, 2008, the contents of which are incorporated by reference herein in their entirety.

FIELD OF THE INVENTION

The present invention relates to a method for fabricating high aspect ratio nanostructures on a substrate.

BACKGROUND OF THE INVENTION

The ability to machine structures of ever-decreasing dimensions is governed by many factors. One such factor is the material's atomic properties with regard to its reduced dimensions. For example, working at the nanometer scale, devices derive their properties from the wave nature of electrons, which must be taken into account when machining. An atomic force microscope (AFM) or scanning force microscope (SFM) is a very high-resolution type of scanning probe microscope commonly used to investigate nanostructures. It has a demonstrated resolution of fractions of a nanometer, which is more than 1000 times better than the optical diffraction limit. Information is gathered by "feeling" the surface's atomic forces with a mechanical probe. Piezoelectric elements facilitate tiny, but extremely accurate and precise movements by electronic or computer control.

The ability to fabricate nanostructures on substrates and repair photomasks at a nanometer scale is particularly desirous and has been facilitated by the advent of the AFM. A photomask is an opaque plate with holes or transparencies that allow electronic radiation energy, usually light, to pass through in a defined pattern. They are commonly used in photolithography, which is a process used in micro fabrication of microprocessors to selectively remove parts of a thin film or the bulk of a substrate. It uses the electronic radiation energy to transfer a geometric pattern from a photomask to an electromagnetic radiation sensitive chemical photo resist on the substrate. A series of chemical treatments then engraves the exposure pattern into the material underneath the photo resist. In a complex integrated circuit, for example, a Complementary Metal-Oxide-Semiconductor (CMOS) wafer will go through the photolithographic cycle up to 100 times and involve up to 100 photomasks (one for each layer).

Moore's law describes a long-term trend in the history of computing hardware. Since the invention of the integrated circuit in 1958, the number of transistors that can be placed inexpensively on an integrated circuit has increased exponentially, doubling approximately every two years The doubling was achieved mostly through the use of enhanced photolithography techniques employing photomasks. Over the past five decades the wavelength of the light source has been reduced to permit smaller feature size with photolithography, but the photomask complexity has also increased. As a result, photomask designers need ways to ensure repeatable and faithful reproduction of a photomask's pattern onto the substrate. Therefore, the most critical issue for the production of photomasks is controlling and eliminating pattern defects in the photomasks.

Integrated circuit designers are using methods called Reticle-enhancement techniques (RETs) to improve reproduction reliability. These techniques have been used with various exposure approaches, such as double-patterning and extreme-ultraviolet (EUV) technologies. One RET is optical proximity correction (OPC), in which subresolution changes to the shape of a feature greatly improve its printability. Smaller, more subtle, and increasingly unavoidable defects in the photomask's features can render expensive photomasks, or even an entire mask set, worthless.

The types of defects on the photomask that may need removal include trimming unwanted carbon patches, removing growth particles and correcting irregularly-shaped quartz bump defects. Currently, there are two options for photomask repair, Focused Ion Beam (FIB) or laser. While each technique has its advantages and unique capabilities, each has its particular limitations. Photomask repair technology has lagged well behind the capability requirements listed in the International Technology Roadmap for Semiconductors (ITRS). The ITRS is a set of documents produced by a group of semiconductor industry experts. These experts are representative of the sponsoring organizations which include the Semiconductor Industry Associations of the US, Europe, Japan, Korea and Taiwan.

Additionally, the need for sub-wavelength resolution has driven the implementation of phase-shifting photomasks for hyper-critical layer processing. The increased complexity of this layering technique has, in turn, dramatically increased photomask costs and cycle time. Advanced alternating phase shift photomasks may cost in excess of $10,000 per layer and take five or six times as long to produce as a standard photomask.

The production of even a single layer photomask for today's multicore microprocessors is a significantly difficult operation, and the results are not always optimal. Additionally, the time to produce, and quality check, a single layer photomask is long. If a layer of a photomask has to be "reshot", the time and cost both go up exponentially. The machines that produce the photomask are expensive, so a fabricator usually schedules their machine for continuous fabrication, i.e., many photomask jobs, in order to recover their costs. If a rewrite of a photomask must be done, it will have adverse effects on the production schedule of the fabrication plant, which may mean missed deadlines and lost contracts. Therefore, it is extremely desirable to be able to repair any existing defects on the photomask after production.

Repair of photomask defects is quickly becoming a necessity. This means that the user of the photomask has neither the time nor the inclination to create a new photomask to replace a defective one. Even a miniscule defect on a photomask will render a microprocessor, created from the defective photomask, inoperable.

Material-subtractive repair technology nanomachining employs an application of atomic force microscopy (AFM). Nanomachining removes mask material, such as opaque defects, with no chemical residuals with unsurpassed depth control. Past technical challenges included poor repair-sidewall angles and poor shape definition in extremely small, high-aspect-ratio patterns. FIG. 1 illustrates the stress placed upon nanomachining tip 14 when removing a defect 11 within a photomask 10. The stress point 15 clearly illustrates the deformation of the nanomachining tip 14, which should be pyramid-shaped. This shape is usually chosen because of its three sided cross sectional properties.

It is therefore desirable to have a method for fabricating precise high aspect ratio nanometer structures, for example, to repair and rejuvenate photomasks used in photolithography, using nanomachining and atomic force microscopy that ensures less nanomachining tip deflection, provides unsurpassed depth control and provides better sidewall shaping. The present invention satisfies that need, as well as others, and overcomes limitations in conventional fabrication methods.

SUMMARY OF THE INVENTION

The foregoing needs are met, to a great extent, by the present invention. In one embodiment, a method for fabricating high aspect ratio nanostructures is provided.

In this embodiment, the method includes (a) positioning the nanomachining tip over a beginning of a first cut proximate to a first boundary of a work area on a substrate; (b) removing material from the surface of the substrate in a first cut direction until an end of the first cut is reached; (c) lifting the nanomachining tip from the cut; (d) positioning the nanomachining tip over a beginning of a subsequent cut adjacent to the end of the previous cut; (e) removing material from the surface of the substrate in a direction that is parallel and opposite to the previous cut direction until an end of the subsequent cut is reached; (f) repeating steps (c), (d) and (e) until a second boundary of the work area is reached; (g) positioning the nanomachining tip over a beginning of a first orthogonal cut adjacent to the first boundary of the work area; (h) removing material from the surface of the substrate in a first orthogonal cut direction until an end of the first orthogonal cut is reached; (i) lifting the nanomachining tip from the orthogonal cut; (j) positioning the nanomachining tip over a beginning of a subsequent orthogonal cut adjacent to the end of the previous orthogonal cut; (k) removing material from the surface of the substrate in a direction that is parallel and opposite to the previous orthogonal cut direction until an end of the subsequent orthogonal cut is reached; (l) repeating steps (i), (j) and (k) until the second boundary of the work area is reached, such that after the completion of step (l), an orthogonal series of isolated cuts defines a grid of high aspect ratio nanostructures in the work area.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

In order that the invention may more readily be understood, reference is directed to the accompanying drawings.

DETAILED DESCRIPTION

Embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

Figure 1:
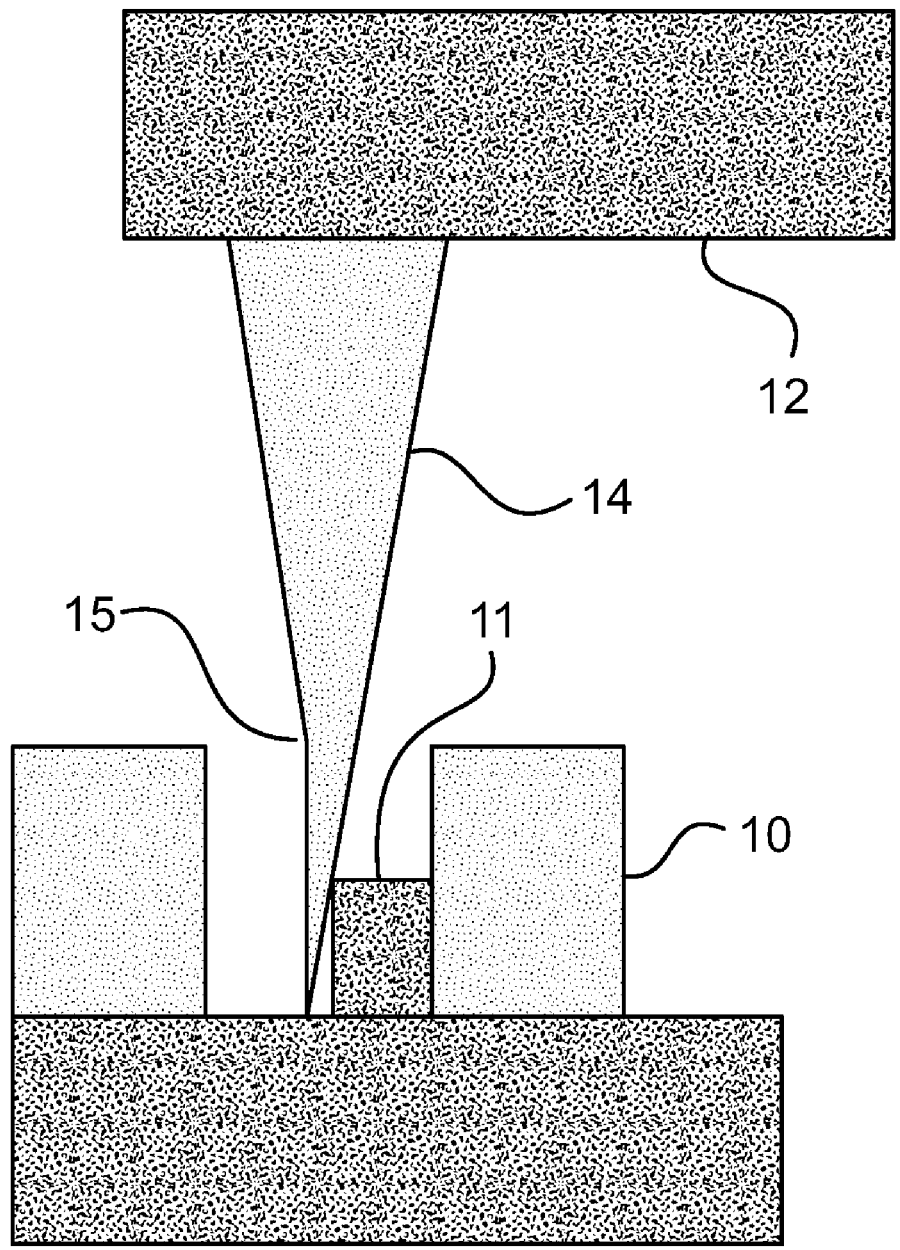
FIG. 1 is an illustration of a nanomachining tool attached to an atomic force microscope illustrating the stress placed upon a nanomachining tip.
Figure 2:
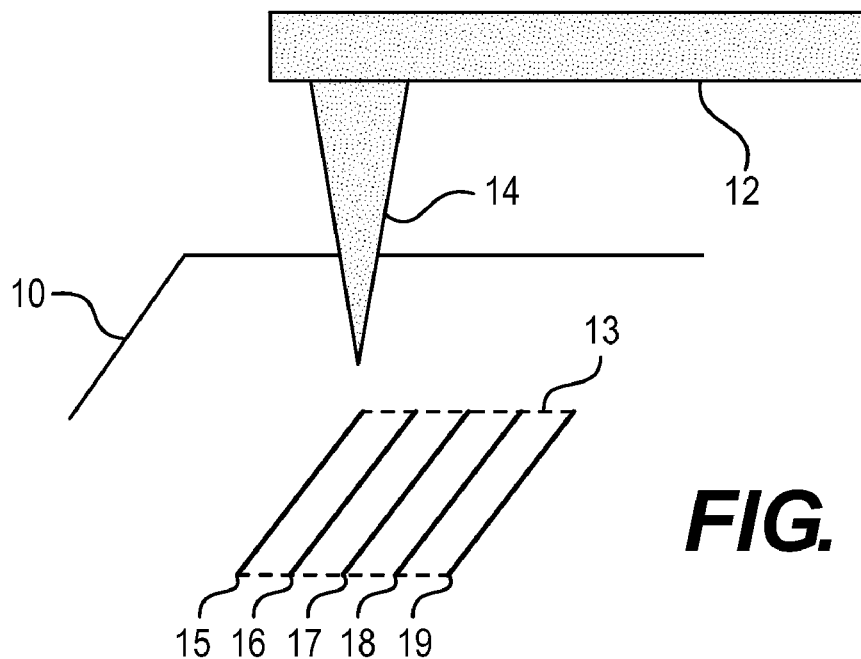
FIG. 2 is an illustration of a nanomachining tool attached to an atomic force microscope after making a series of parallel material extractions on a photomask or substrate.

FIG. 2 depicts a substrate or photomask 10 that has a desired work area or defect region 13. A cantilever arm 12 of an atomic force microscope platform holds a first nanomachining tip 14. A first pass of individual parallel passes (cuts) 15-19 are sliced through the work area or defect region 13 at depths less than 30 nanometers depending on the material of the substrate or photomask 10 and the characteristics of the first nanomachining tip 14.

The process begins by positioning the nanomachining tip 14 at the beginning of a first pass 15. After pass 15 is carried out, the nanomachining tip 14 is lifted and repositioned and pass 16 is performed. After pass 16, the nanomachining tip 14 is lifted and pass 17 is performed. The iterative process is continued until all the parallel passes 15 through 19 are complete. This technique minimizes progressive tip deflection from material compression and debris pile-up which may accumulate as the material extraction process is carried out.

Figure 3:
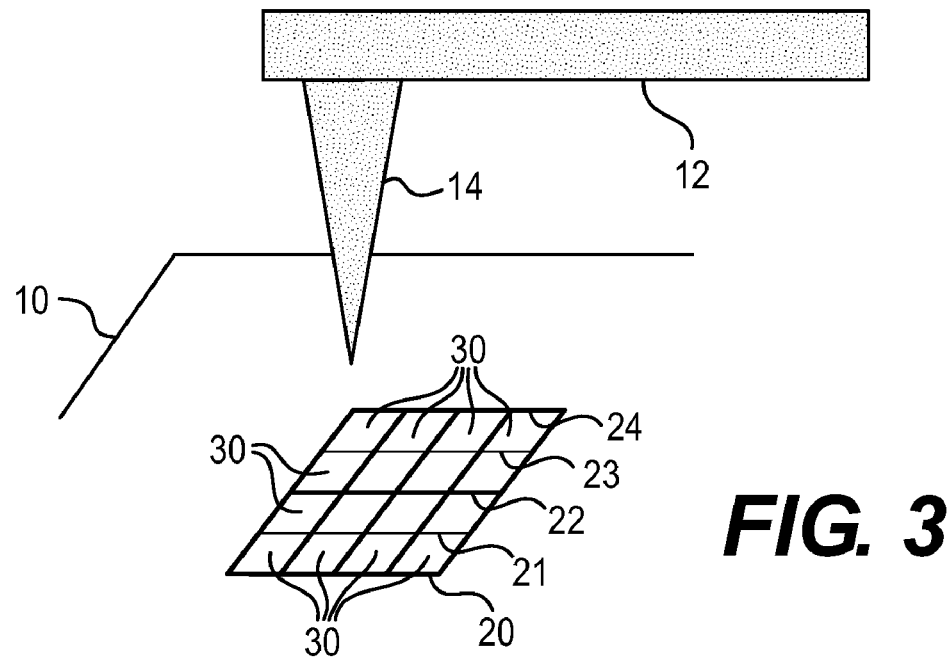
FIG. 3 is an illustration of the nanomachining tool attached to an atomic force microscope after making a series of orthogonal material extractions on the photomask or substrate.

The next set of passes 20-24 as illustrated in FIG. 3 are similar to the first, except they are orthogonal to the parallel passes 20-24. For example, pass 20 is carried out, the nanomachining tip 14 is lifted and repositioned and pass 21 is performed. After pass 21, the nanomachining tip 14 is lifted and pass 22 is performed. The process of incrementing the index to the next pass is continued until all the parallel passes 20 through 24 are complete.

Figure 4:
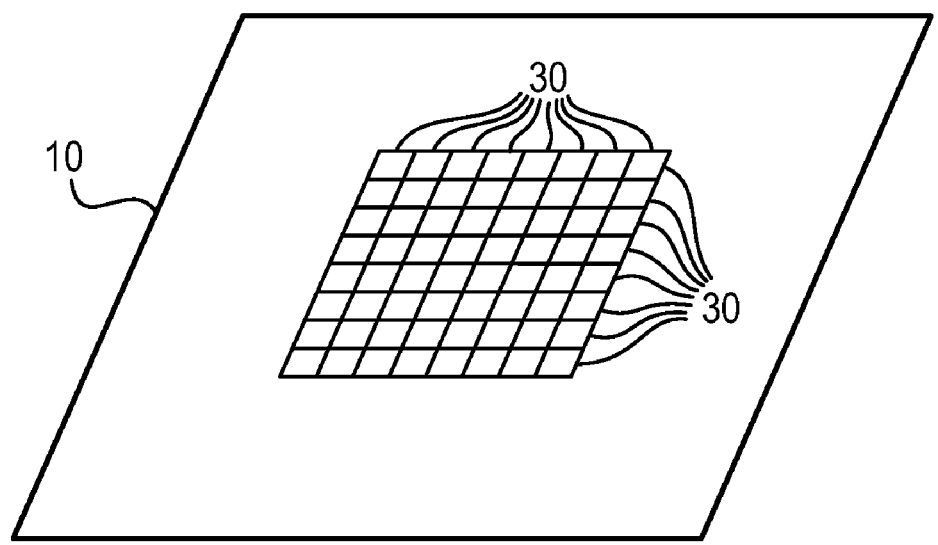
FIG. 4 is an illustration of the photomask or substrate after an additional series of parallel orthogonal material extractions.
Figure 5:
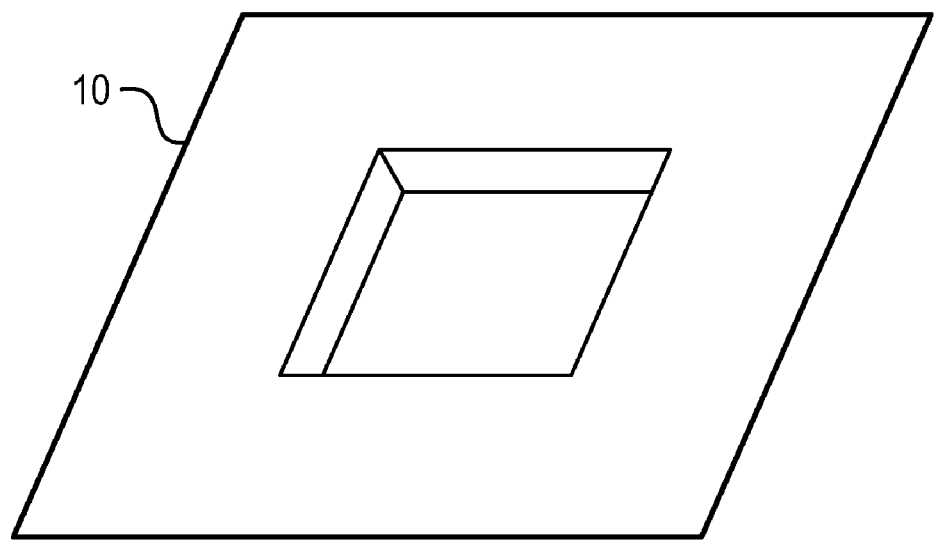
FIG. 5 is an illustration of the photomask or substrate after the material has been removed.
Figure 6:
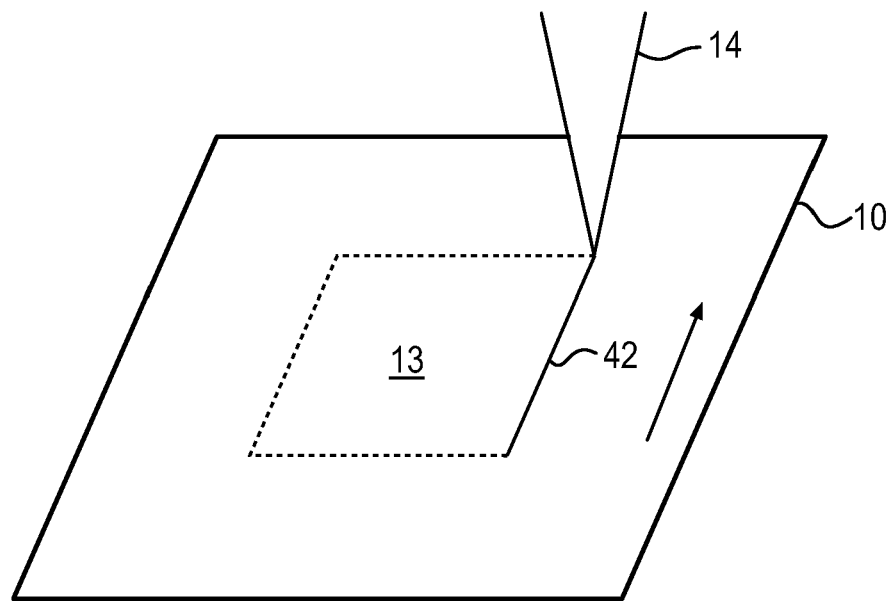
FIG. 6 is an illustration of the nanomachining probe after making a first permitter pass.
Figure 7:
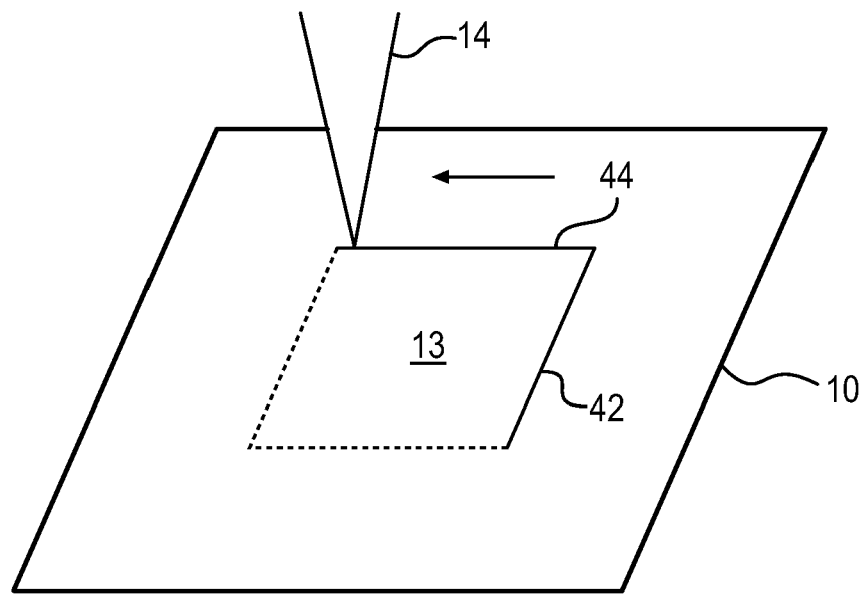
FIG. 7 is an illustration of the nanomachining probe after making a second permitter pass.
Figure 8:
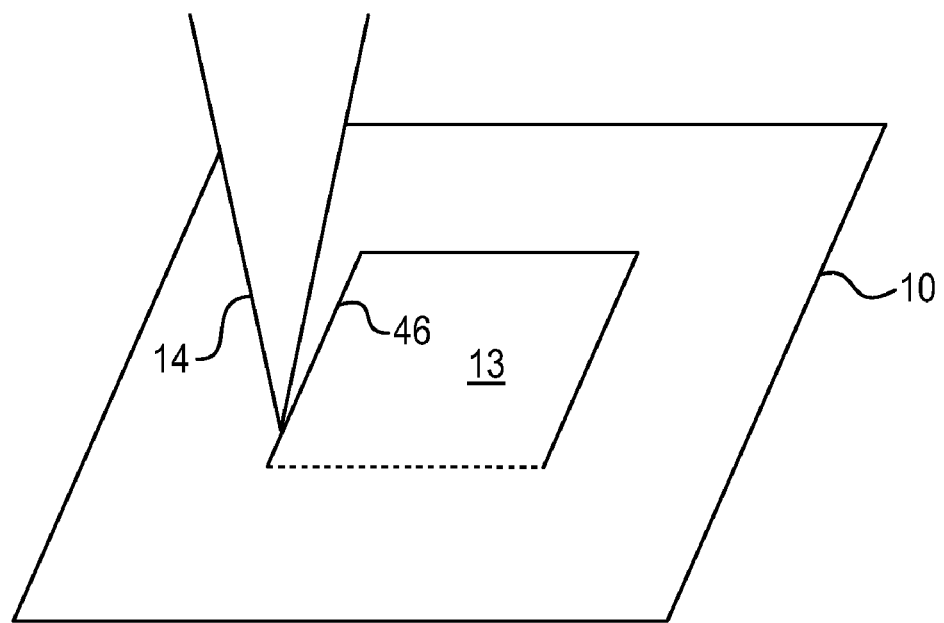
FIG. 8 is an illustration of the nanomachining probe after making a third permitter pass.
Figure 9:
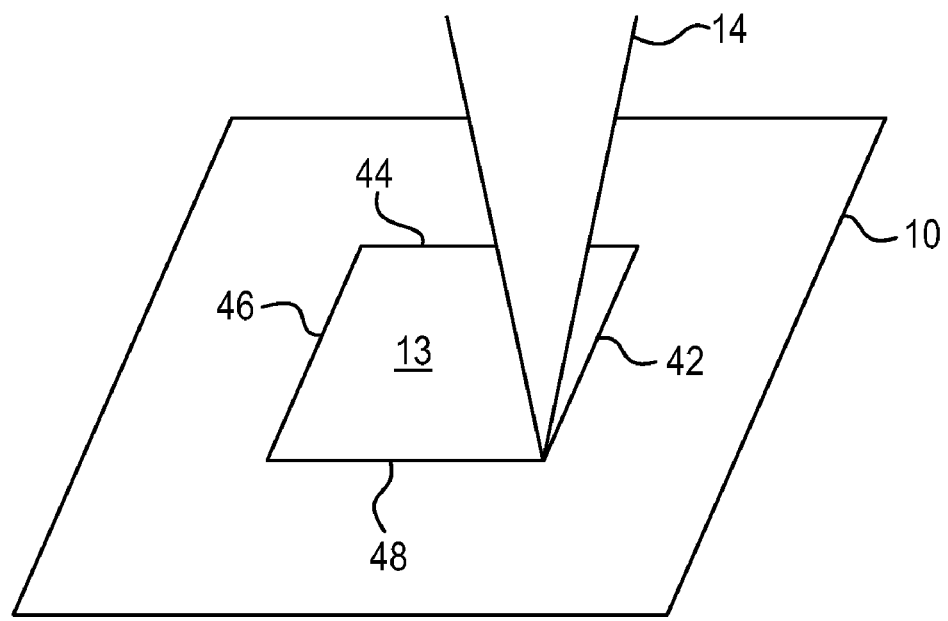
FIG. 9 is an illustration of the nanomachining probe after making a forth permitter pass.

The alternating sequence of orthogonal passes can be repeated until a desired depth of the work area or defect region 13 is achieved, thereby fabricating a grid of small isolated pillars 30, i.e., high aspect ratio nanostructures, in the work area or defect region 13, as shown in FIG. 4. One or more of the pillars 30 in the work area 13 can be made smooth using nanomachining tip 14, or using an additional tip or tips depending on the precision required. If the defect region 13 is to be completely repaired, then all of the pillars 30 can be removed, as shown in FIG. 5. Different tips, with differing aspect ratios or different material compositions, can be used to "smooth" out or polish the bottom of the work area or defect region 13.

In an alternative embodiment, a next series of passes would be performed, but the nanomachining tip 14 would be offset from its first set of passes. For example, the nanomachining tip 14 is directed to perform a series of passes that would traverse through the center of the pillars 30, paralleling the channels "cut" from a previous pass, permitting a finer control of the debris removal.

In yet another embodiment, one or more sets of orthogonal passes of the nanomachining tip 14 is performed, but at ever increasing depths until a desired depth is achieved. This embodiment removes the material in discrete depth levels. The nanomachining tip 14 can also be changed to a different nanomachining tip with a different aspect ratio or physical characteristic(s) to assist in the removal of the undesired material.

In another embodiment, the perimeter of the work area or defect region 13 is first "carved out" before the orthogonal crosshatching is performed. An advantage of this embodiment is that it helps preserve the shape fidelity. This is achieved by minimizing the amount of material displaced when the pillars are produced by the orthogonal cuts, while defining the repair area for the subsequent debris removal. This embodiment also minimizes the potential for accumulating repair debris which would prevent the nanomachining tip 14 from accurately defining the repair shape. The perimeter could be used as a repository for any removed material, thus helping keep the nanomachining tip 14 clean of any debris which could cause drag or deflections which could impede the nanomachining tip's ability to traverse a straight cut. The perimeter also greatly reduces or eliminates lateral deflection when making parallel cuts, because it helps prevent drag or deflections when performing the cuts in the parallel direction. Additional subsequent cuts would be preferentially deflected into prior cuts resulting in a self-aligning repair process.

For example, referring to FIGS. 6-9, a first pass 42 of the nanomachining tip 14 defines a first portion of perimeter of the work area or defect region 13. A second pass 44, a third pass (cut) 46 and a fourth pass (cut) 48 complete the scribing of the perimeter. The perimeter cutting process may be repeated if a deeper work area is preferred, usually to within 0-20 nanometers of a desired depth. The steps described above may be performed to remove the material from the work area or defect region 13. In a preferred embodiment, the nanomachining tip 14 may be lifted between each perimeter cut. In an alternative embodiment, the nanomachining tip 14 is not lifted between each perimeter cut.

In another embodiment, the perimeter cuts can be at different offsets. The user could progressively increase the depth of the cuts as the nanomachining tip 14 works its way around the perimeter. The cut depth could be increased after each complete perimeter pass, increased before the direction is changed, or increased gradually throughout the entire perimeter cutting process.

In other embodiments, the sequence and directions of the cuts can be controlled to enhance the shape of the repair. For example, indents start at the worst-resolved corners, with the subsequent cuts moving towards the best-resolved corners.

Finally, it is to be understood that various alterations, modifications and/or additions may be introduced into the constructions and arrangements of parts previously described without departing from the spirit or ambit of the invention.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method for fabricating high aspect ratio nanostructures on a substrate using a nanomachining tip of an atomic force microscope, comprising:
   (a) positioning the nanomachining tip over a beginning of a first cut proximate to a first boundary of a work area on a substrate;
   (b) removing material from the surface of the substrate in a first cut direction until an end of the first cut is reached;
   (c) lifting the nanomachining tip from the cut;
   (d) positioning the nanomachining tip over a beginning of a subsequent cut adjacent to the end of the previous cut;
   (e) removing material from the surface of the substrate in a direction that is parallel and opposite to the previous cut direction until an end of the subsequent cut is reached;
   (f) repeating steps (c), (d) and (e) until a second boundary of the work area is reached;
   (g) positioning the nanomachining tip over a beginning of a first orthogonal cut adjacent to the first boundary of the work area;
   (h) removing material from the surface of the substrate in a first orthogonal cut direction until an end of the first orthogonal cut is reached;
   (i) lifting the nanomachining tip from the orthogonal cut;
   (j) positioning the nanomachining tip over a beginning of a subsequent orthogonal cut adjacent to the end of the previous orthogonal cut;
   (k) removing material from the surface of the substrate in a direction that is parallel and opposite to the previous orthogonal cut direction until an end of the subsequent orthogonal cut is reached; and
   (l) repeating steps (i), (j) and (k) until the second boundary of the work area is reached,
   wherein after the completion of step (l), an orthogonal series of isolated cuts defines a grid of high aspect ratio nanostructures in the work area.

2. The method according to claim 1, further comprising (m) removing additional material to smooth out at least one of the nanostructures in the work area.

3. The method according to claim 1, wherein the end of the subsequent cut is proximate to the beginning of the previous cut.

4. The method according to claim 3, wherein the end of the subsequent orthogonal cut is proximate to the beginning of the previous orthogonal cut.

5. The method according to claim 4, wherein the end of the first orthogonal cut is proximate to the end of the first cut.

6. The method according to claim 5, wherein the cut depth is less than 30 nanometers.

7. The method according to claim 2, further comprising immediately prior to step (m), replacing the nanomachining tip with a nanomachining tip having a different aspect ratio.

8. The method according to claim 1, further comprising (m) repeating steps (a) through (l) at increasing cut depths until a desired depth is achieved.

9. The method according to claim 1, further comprising prior to step (a), (1) creating a work area perimeter.

10. The method according to claim 9, wherein step (1) includes:
- positioning the nanomachining tip over a beginning of a first perimeter cut proximate to a third boundary of the work area;
- removing material from the surface of the substrate in a first perimeter cut direction until an end of the first perimeter cut is reached;
- lifting the nanomachining tip from the first perimeter cut;
- positioning the nanomachining tip over a beginning of a second perimeter cut proximate to the first boundary of the work area;
- removing material from the surface of the substrate in a direction that is parallel to the first perimeter cut direction until an end of the second perimeter cut is reached;
- positioning the nanomachining tip over a beginning of a first orthogonal perimeter cut adjacent to the beginning of the second perimeter cut;
- removing material from the surface of the substrate in a first orthogonal perimeter cut direction until an end of the first orthogonal perimeter cut is reached;
- lifting the nanomachining tip from the first orthogonal perimeter cut;
- positioning the nanomachining tip over a beginning of a second orthogonal perimeter cut adjacent to the end of the second perimeter cut;
- removing material from the surface of the substrate in a direction that is parallel to the first orthogonal perimeter cut direction until the end of the first perimeter cut is reached.

11. The method according to claim 9, wherein step (1) includes:
- positioning the nanomachining tip over a beginning of a first perimeter cut proximate to a third boundary of the work area;
- removing material from the surface of the substrate in a first perimeter cut direction until an end of the first perimeter cut is reached;
- lifting the nanomachining tip from the first perimeter cut;
- positioning the nanomachining tip over a beginning of a first orthogonal perimeter cut proximate to the end of the first perimeter cut;
- removing material from the surface of the substrate in a direction that is orthogonal to the first perimeter cut direction until an end of the first orthogonal perimeter cut is reached;
- positioning the nanomachining tip over a beginning of a second perimeter cut adjacent to the end of the first orthogonal perimeter cut;
- removing material from the surface of the substrate in a second perimeter cut direction parallel and opposite to the first perimeter cut direction until an end of the second perimeter cut is reached;
- lifting the nanomachining tip from the second perimeter cut;
- positioning the nanomachining tip over a beginning of a second orthogonal perimeter cut adjacent proximate to the first boundary of the work area;
- removing material from the surface of the substrate in a direction that is parallel and opposite to the first orthogonal perimeter cut direction until the beginning of the first perimeter cut is reached.

12. The method according to claim 1, wherein, in step (d), the beginning of the subsequent cut is 1 to 20 nanometers from the end of the previous cut.

13. The method according to claim 1, wherein, in step (j), the beginning of the subsequent orthogonal cut is 1 to 20 nanometers from the end of the previous orthogonal cut.

* * * * *